(12) United States Patent
Oda

(10) Patent No.: US 9,696,857 B2
(45) Date of Patent: Jul. 4, 2017

(54) SIGNAL PROCESSING CIRCUIT, SIGNAL PROCESSING METHOD, POSITION DETECTING DEVICE, AND ELECTRONIC APPARATUS

(71) Applicant: Wacom Co., Ltd., Saitama (JP)

(72) Inventor: Yasuo Oda, Saitama (JP)

(73) Assignee: Wacom Co., Ltd., Saitama (JP)

( * ) Notice: Subject to any disclaimer, the term of this patent is extended or adjusted under 35 U.S.C. 154(b) by 432 days.

(21) Appl. No.: 13/948,005

(22) Filed: Jul. 22, 2013

(65) Prior Publication Data

US 2014/0098039 A1 Apr. 10, 2014

(30) Foreign Application Priority Data

Oct. 4, 2012 (JP) .................................. 2012-222472

(51) Int. Cl.
| | |
|---|---|
| *G06F 3/044* | (2006.01) |
| *G06F 3/041* | (2006.01) |
| *H03K 17/96* | (2006.01) |
| *G09G 3/00* | (2006.01) |

(52) U.S. Cl.
CPC ............ *G06F 3/044* (2013.01); *G06F 3/0416* (2013.01); *H03K 17/962* (2013.01); *H03K 17/9622* (2013.01); *G09G 3/001* (2013.01); *H03K 2217/960725* (2013.01)

(58) Field of Classification Search
CPC ...... G01F 23/265; G06F 3/0416; G06F 3/044; G09G 3/001; H03K 17/962; H03K 2217/960725; H03K 17/9622
See application file for complete search history.

(56) References Cited

U.S. PATENT DOCUMENTS

| | | | |
|---|---|---|---|
| 4,550,310 A * | 10/1985 | Yamaguchi | .......... H03K 17/962 307/116 |
| 6,476,799 B1 | 11/2002 | Lee et al. | |
| 8,487,891 B2 | 7/2013 | Oda et al. | |

(Continued)

FOREIGN PATENT DOCUMENTS

| | | |
|---|---|---|
| JP | 2011003035 A | 1/2011 |
| JP | 2011003036 A | 1/2011 |
| JP | 2011-166240 A | 8/2011 |

(Continued)

OTHER PUBLICATIONS

Extended European Search Report dated Feb. 7, 2014, for corresponding European Application No. 13182717.2-1904, 7 pages.

*Primary Examiner* — Nicholas Lee
*Assistant Examiner* — Richard Hong
(74) *Attorney, Agent, or Firm* — Seed IP Law Group LLP

(57) ABSTRACT

A signal processing circuit is provided, which is suitable to be connected to a signal receiving conductor of a capacitive position detecting sensor, which has low power consumption and small circuit scale, and which allows setting of a small value as the capacitance value of a capacitor used for I-V conversion. After a receiving conductor is clamped to a predetermined potential by a clamp circuit, this receiving conductor clamped to the predetermined potential is connected to a capacitor circuit via a gate circuit. Thereby, a potential that changes corresponding to a position indicated by an indicator such as a finger is generated in the capacitor circuit, and a voltage signal generated in this capacitor circuit is converted to a digital signal to be output.

15 Claims, 7 Drawing Sheets

(56) References Cited

U.S. PATENT DOCUMENTS

| | | | |
|---|---|---|---|
| 2005/0073324 A1* | 4/2005 | Umeda | G01R 27/2605 324/662 |
| 2008/0036473 A1* | 2/2008 | Jansson | G06F 3/03547 324/678 |
| 2008/0142281 A1* | 6/2008 | Geaghan | G06F 3/044 178/18.06 |
| 2009/0167325 A1* | 7/2009 | Geaghan | G01D 5/24 324/660 |
| 2010/0085322 A1* | 4/2010 | Mamba | G06F 3/044 345/173 |
| 2010/0177058 A1 | 7/2010 | Lin | |
| 2010/0321313 A1 | 12/2010 | Oda et al. | |
| 2010/0321314 A1 | 12/2010 | Oda et al. | |
| 2010/0321315 A1 | 12/2010 | Oda et al. | |
| 2010/0321331 A1 | 12/2010 | Oda et al. | |
| 2010/0321332 A1 | 12/2010 | Oda et al. | |
| 2010/0321333 A1 | 12/2010 | Oda et al. | |
| 2010/0321334 A1* | 12/2010 | Oda | G06F 3/044 345/174 |
| 2011/0074609 A1* | 3/2011 | Lin | G06F 3/044 341/33 |
| 2012/0075239 A1* | 3/2012 | Azumi | G06F 3/044 345/174 |
| 2012/0146940 A1 | 6/2012 | Yamamoto et al. | |

FOREIGN PATENT DOCUMENTS

| | | |
|---|---|---|
| JP | 2011-233018 A | 11/2011 |
| JP | 2011-237902 A | 11/2011 |
| JP | 2011243081 A | 12/2011 |
| JP | 2012123599 A | 6/2012 |
| TW | 413784 B | 12/2000 |

* cited by examiner

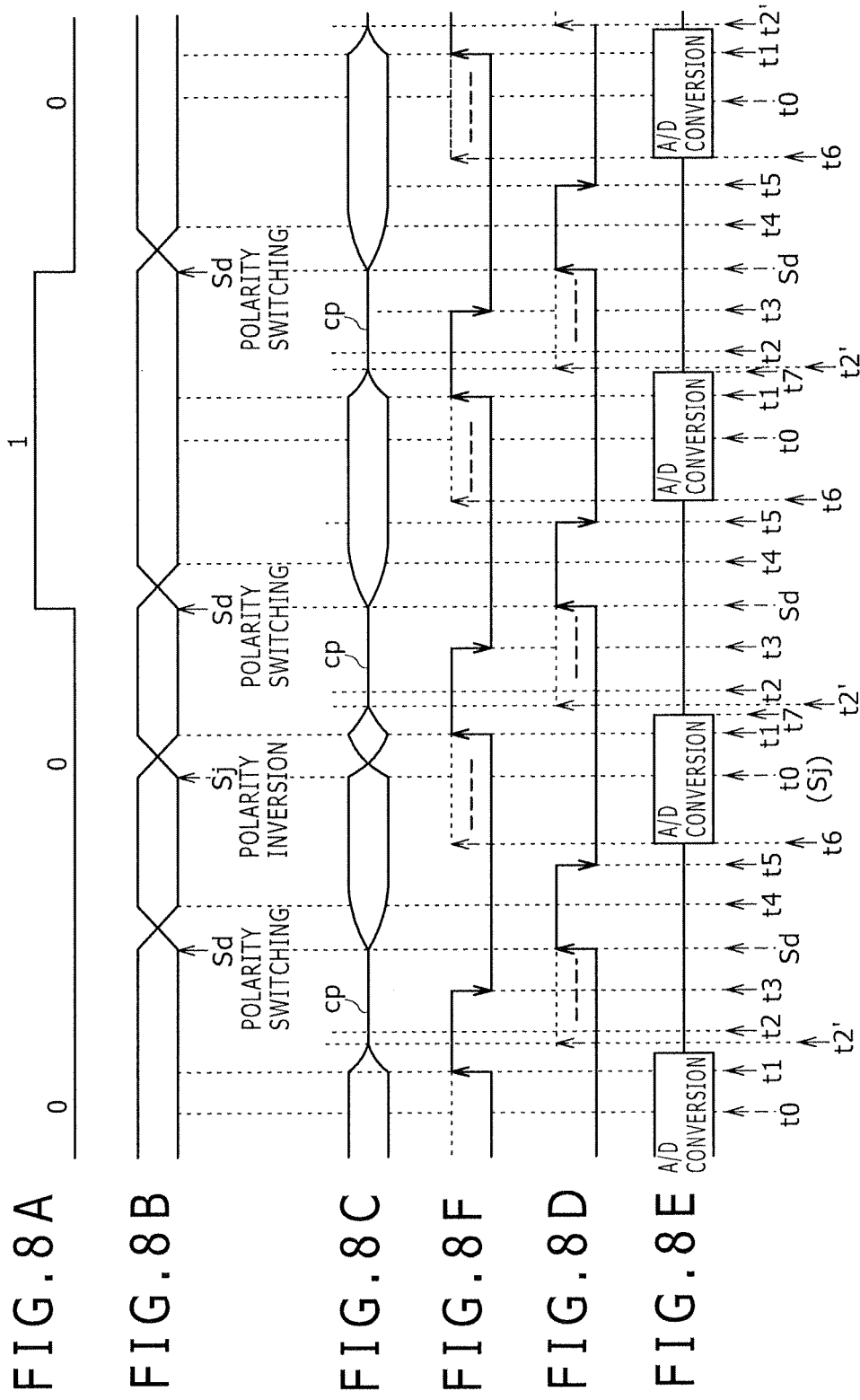

SIGNAL PROCESSING CIRCUIT, SIGNAL PROCESSING METHOD, POSITION DETECTING DEVICE, AND ELECTRONIC APPARATUS

CROSS-REFERENCE TO RELATED APPLICATION

The present application claims priority under 35 U.S.C. 119(a) to Japanese Patent Application No. 2012-222472, filed Oct. 4, 2012, which is incorporated by reference herein.

BACKGROUND

Technical Field

This invention relates to a signal processing circuit and a signal processing method that are suitable to be used together with a capacitive position detecting sensor, which allows detection of the respective indicated positions by plural indicators such as fingers (multipoint detection), and a position detecting device and electronic apparatus incorporating such circuit and method.

Description of the Related Art

Position detecting devices such as a touch panel have come to be widely used and various inventions relating to the position detecting devices have been made. For example, Japanese Patent Laid-open No. 2011-243081 (Patent Document 1) discloses an invention relating to a capacitive touch panel device. In the invention disclosed in Patent Document 1, plural transmitting electrodes 2 and plural receiving conductors 3 are disposed in a lattice manner to form a panel main body 4 and predetermined signals are supplied to the transmitting electrodes 2. At a position indicated by a finger as an indicator, a current is shunted via the finger. Due to this, capacitance formed between the transmitting electrode 2 and the receiving conductor 3 changes. This capacitance change is detected as the change in the current flowing in the receiving conductor 3.

Therefore, the position indicated by the indicator on the panel main body 4 can be detected by detecting the current change at the respective intersections of the transmitting electrodes 2 and the receiving conductors 3. However, the current that changes in the receiving conductor 3 is weak. Thus, the weak current is converted to a voltage of a proper signal level and then processed. Also in the above-described Patent Document 1, it is explained that a weak current flowing in the receiving conductor 3 is converted to a voltage to be processed by using an I-V converter (current-voltage converter) 31 using an operational amplifier OPA.

BRIEF SUMMARY

Problems to be Solved by the Invention

By the way, the touch panel device including the I-V converter like that disclosed in the above-described Patent Document 1 is unsuitable as an input device of portable apparatus such as a smartphone or the like, which is rapidly becoming popular in recent years. The smartphone has a display screen of e.g., about four inches and has a function to detect an indicated position by an indicator such as a pen or a finger of the user through a touch panel device (position detecting device) disposed on this display screen. As portable apparatus, the smartphone is desired to achieve power consumption saving, size reduction, and weight reduction.

However, the I-V converter (current-voltage converter) generally has a configuration in which a capacitor and a resistor are connected between the input and output terminals of an operational amplifier also as shown in FIG. 5 of the above-described Patent Document 1, and has high power consumption due to performance of current-voltage conversion using the operational amplifier. Furthermore, a capacitor having a comparatively large capacitance value is needed for the I-V converter. In the case of forming a capacitor in an integrated circuit (IC) by using a semiconductor process, the semiconductor area to form the capacitor is very large compared with other circuit elements, which makes it difficult to form the IC. Therefore, the touch panel device described in Patent Document 1 has a configuration in which plural receiving conductors share one I-V converter 31, and current-voltage conversion is performed with the plural receiving conductors connected to one I-V converter 31 via a switch circuit 21.

However, if plural receiving conductors share one I-V converter 31, possibly, detection processing of an indicated position is not timely executed depending on the relationship between the speed of processing for sequentially switching the plural receiving conductors to connect them to one I-V converter 31 and converting a current to a voltage, and the movement speed of the indicator on the touch panel. In this case, possibly, detection of an indicated position by an indicator at proper timing is missed.

In view of the above-described points, according to an aspect of the present invention, a signal processing circuit and a signal processing method are provided that have low power consumption and also small circuit scale, and that allow setting of a small value as the capacitance value of the capacitor used for I-V conversion. A position detecting device and electronic apparatus using such circuit and method are also provided.

Means for Solving the Problems

To solve the above-described problems, a signal processing circuit of the invention set forth in claim 1 is a signal processing circuit connected to a signal receiving conductor of a capacitive position detecting sensor. The capacitive position detecting sensor includes a plurality of signal transmitting conductors disposed along a first direction and a plurality of the signal receiving conductors disposed along a second direction intersecting the first direction, and detects change in capacitance corresponding to position indication by an indicator. The signal processing circuit includes a clamp circuit, a gate circuit, a capacitor circuit, and a gate control circuit. The signal receiving conductor and one terminal of the gate circuit are connected to one terminal of the clamp circuit. One terminal of the capacitor circuit is connected to the other terminal of the gate circuit. A predetermined potential is set for each of the other terminal of the clamp circuit and the other terminal of the capacitor circuit. The signal receiving conductor set to the predetermined potential via the clamp circuit is connected to the capacitor circuit via the gate circuit by carrying out conduction control of the gate circuit by the gate control circuit, to allow the change in the capacitance corresponding to the position indication by the indicator to be output as a voltage signal from the capacitor circuit.

According to this signal processing circuit of the invention set forth in claim 1, after the receiving conductor is clamped to the predetermined potential by the clamp circuit, this receiving conductor clamped to the predetermined potential is connected to the capacitor circuit via the gate circuit. Thereby, a potential that changes corresponding to the position indicated by the indicator such as a finger is generated in the capacitor circuit and this potential generated in the capacitor circuit is output as the voltage signal.

Due to this feature, the circuit configuration can be simplified and power saving is achieved compared with the case of using a conventional I-V conversion circuit (current-voltage conversion circuit) configured by using an operational amplifier. Furthermore, the capacitance value of the capacitor used in this invention can be set to a smaller value compared with the capacitance value of the capacitor used in the I-V conversion circuit using the operational amplifier. Therefore, the circuit scale when the capacitor circuit is formed in an integrated circuit can be reduced. Accordingly, according to this invention, because power saving and small circuit scale can be realized, a position detecting device and electronic apparatus having a circuit configuration in which an I-V conversion circuit is connected to each of plural receiving conductors can be realized.

Effect of the Invention

According to this invention, it is possible to realize a signal processing circuit and a signal processing method that have low power consumption and also small circuit scale and therefore are suitable to be used with a capacitive position detecting sensor and a position detecting device and electronic apparatus desired to achieve size reduction, weight reduction, and long-time use (based on lowered power consumption).

BRIEF DESCRIPTION OF THE DRAWINGS

FIGS. 8A-8F are timing charts for explaining the operation of the signal processing circuit of the second embodiment of this invention.

DETAILED DESCRIPTION

Embodiments of the signal processing circuit, the signal processing method, the position detecting device, and the electronic apparatus of this invention will be described below with reference to the drawings. The signal processing circuit and the signal processing method of this invention are suitable to be applied to a capacitive position detecting sensor.

First Embodiment

Figure 1:
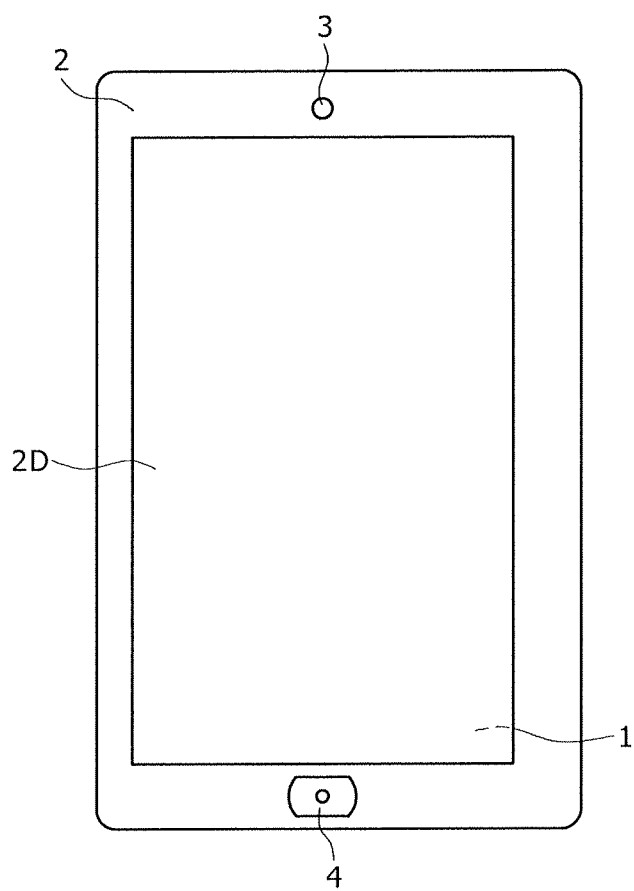
FIG. 1 is a diagram for explaining electronic apparatus to which this invention is applied.

Position Detecting Device to which Signal Processing Circuit and Signal Processing Method of this Invention are Applied FIG. 1 shows one example of electronic apparatus including a position detecting device 1 configured by applying one embodiment of the signal processing circuit and the signal processing method of this invention thereto. Electronic apparatus 2 shown in FIG. 1 is portable apparatus that has a display screen 2D of a display device such as a liquid crystal display (LCD) and is called a smartphone or the like. A touch panel configuring the capacitive position detecting device 1 is disposed in front of the display screen 2D. An earpiece 3 and a mouthpiece 4 are provided at the upper part and lower part, respectively, of the electronic apparatus 2. Details of this position detecting device 1 will be described later.

When position indication operation is carried out by a finger or the like on the touch panel disposed in front of the display screen 2D of the electronic apparatus 2, the position detecting device 1 detects the position indicated by the finger or the like, and display processing according to the indicated position is executed by a microcomputer included in the electronic apparatus 2.

Configuration Example of Capacitive Position Detecting Device

Figure 2:
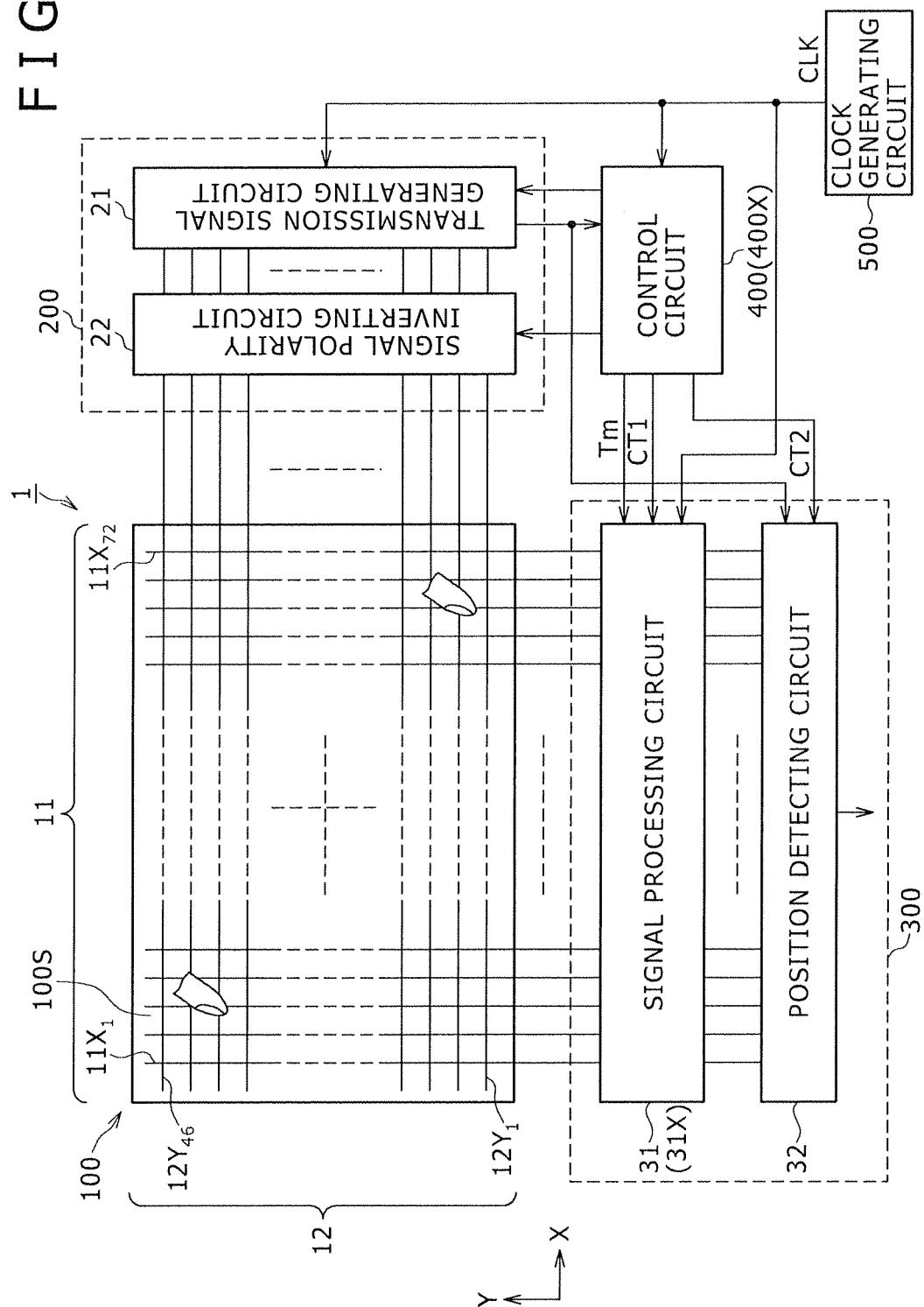
FIG. 2 is a diagram for explaining a configuration example of a position detecting device to which this invention is applied.

A configuration example of the position detecting device 1 used in the electronic apparatus 2 shown in FIG. 1 and so forth will be described below. FIG. 2 is a diagram for explaining the configuration example of the position detecting device 1 of this embodiment. The position detecting device 1 of this embodiment is configured by applying one embodiment of the signal processing circuit and the signal processing method of this invention thereto. The position detecting device 1 of this embodiment is a cross-point capacitive device. The principle and so forth of the cross-point capacitive position detecting device are explained in detail in Japanese Patent Laid-open Nos. 2011-3035, 2011-3036, 2012-123599, and so forth, which are published unexamined patent applications of the assignee of this patent application.

As shown in FIG. 2, the position detecting device 1 of this embodiment includes a sensor section 100 configuring the touch panel (position detecting sensor), a transmitting section 200, a receiving section 300, a control circuit 400, and a clock generating circuit 500. The control circuit 400 is a circuit for controlling the respective sections of the position detecting device 1 of this embodiment and is configured by mounting a microcomputer for example. The clock generating circuit 500 generates a predetermined clock signal and supplies it to the respective sections. Depending on the case, it is included in a microcomputer or the like.

The sensor section 100 is formed by stacking a transmitting conductor group 12, an insulating layer, and a receiving conductor group 11 in that order from the lower layer side. The transmitting conductor group 12 is obtained by disposing plural transmitting conductors $12Y_1, 12Y_2, \ldots, 12Y_{46}$ extending along the X-axis direction in FIG. 2 in parallel separately from each other by a predetermined interval. The receiving conductor group 11 is obtained by disposing plural receiving conductors $11X_1, 11X_2, \ldots, 11X_{72}$ extending along a direction intersecting the transmitting conductors $12Y_1, 12Y_2, \ldots, 12Y_{46}$ (Y-axis direction in FIG. 2) in parallel separately from each other by a predetermined interval.

In the position detecting device 1 of this embodiment, the plural receiving conductors $11X_1, 11X_2, \ldots, 11X_{72}$ configuring the receiving conductor group 11 are first conductors and the plural transmitting conductors $12Y_1, 12Y_2, \ldots, 12Y_{46}$ configuring the transmitting conductor group 12 are second conductors. As above, the cross-point capacitive position detecting device has a configuration in which a position indicated by an indicator such as a finger is detected based on change in the capacitance at the respective intersections formed by crossing of the transmitting conductors and the receiving conductors.

The position detecting device 1 of this embodiment is so used as to be mounted in portable apparatus called a smartphone for example as explained by using FIG. 1. For this purpose, in the sensor section 100, an indication input surface 100S that corresponds to the size of the display screen of a display device included in the portable apparatus and has a screen size of e.g., about four inches is formed by the receiving conductor group 11 and the transmitting conductor group 12 having optical transparency. As the display device of the portable apparatus, a thin display such as a liquid crystal display (LCD) or an organic electro-luminescence (EL) display is used. The receiving conductor group 11 and the transmitting conductor group 12 may have a configuration in which they are disposed on the same surface side of the sensor substrate or a configuration may be employed in which the receiving conductor group 11 is disposed on one surface side of the sensor substrate and the transmitting conductor group 12 is disposed on the other surface side.

In this embodiment, the transmitting conductor group 12 of the sensor section 100 is composed of 46 transmitting conductors $12Y_1$ to $12Y_{46}$ as shown in FIG. 2. A transmission signal generating circuit 21 of the transmitting section 200 generates 46 different transmission signals and supplies the predetermined transmission signal to each of the transmitting conductors $12Y_1, 12Y_2, \ldots, 12Y_{46}$ at timing formed based on a clock signal CLK from the clock generating circuit 500 in accordance with control of the control circuit 400. As a specific example of the transmission signal supplied to each of 46 transmitting conductors $12Y_1$ to $12Y_{46}$, e.g., an orthogonal code such as the pseudo random noise (PN) code and the Hadamard code can be used.

A signal polarity inverting circuit 22 of the transmitting section 200 executes processing of switching (inverting) the polarity of the transmission signal according to need based on the code string of the transmission signal. The position detecting device 1 of this embodiment is a cross-point capacitive device also as described above. It detects the position of an indicator based on change in a signal induced in the receiving conductors $11X_1$ to $11X_{72}$ depending on the transmission signals supplied to the transmitting conductors $12Y_1, 12Y_2, \ldots, 12Y_{46}$ and employs a position detection system based on change in the capacitance corresponding to the indicated position by an indicator such as a finger.

Therefore, to address the case in which "0" is consecutive in the transmission signal generated by the transmission signal generating circuit 21 or conversely "1" is consecutive, the signal polarity inverting circuit 22 determines whether or not the signal (code) immediately previously supplied to the respective transmitting conductors $12Y_1, 12Y_2, \ldots, 12Y_{46}$ is the same as the signal (code) that should be supplied next, and generates the transmission signal (transmission code) whose signal level (high level/low level) is switched (or inverted) if the same signal (code) is consecutive.

Specifically, if "0" is consecutive in the transmission signal like "00," after the first "0" for which the signal level is set to the low level is transmitted, the signal level of the transmission signal is temporarily set to the high level. Thereafter, the signal level is set to the low level in association with transmission of the next "0." Conversely, if "1" is consecutive in the transmission signal like "11," after the first "1" for which the signal level is set to the high level is transmitted, the signal level of the transmission signal is temporarily set to the low level. Thereafter, the signal level is set to the high level in association with transmission of the next "1."

The processing of setting the signal level of the transmission signal to the high level or low level prior to signal transmission in this manner to thereby properly set the rising or falling of the transmission signal is referred to as polarity inversion processing in this specification. If the transmission signal transmits different signals (codes) like "01" or "10," polarity switch (polarity inversion) of the transmission signal does not need to be performed because the rising or falling of the transmission signal is properly set.

As above, the position detecting device 1 of this embodiment employs a capacitive system in which a position indicated by an indicator such as a finger is detected based on change in the capacitance. Therefore, the rising and falling of the transmission signal are properly set by controlling the signal levels of the transmission signals supplied to the transmitting conductors $12Y_1, 12Y_2, \ldots, 12Y_{46}$ by the signal polarity inverting circuit 22. According to this, the signal levels of the received signals induced in the receiving conductors $11X_1, 11X_2, \ldots, 11X_{72}$ also properly change. The received signals induced in the receiving conductors $11X_1, 11X_2, \ldots, 11X_{72}$ are monitored and it is detected which transmitting conductor is the transmitting conductor, to which the transmission signal corresponding to the received signal that has changed is supplied.

That is, in the receiving section 300 of the position detecting device 1 of this embodiment, change in the signal corresponding to change in the capacitance, induced at the intersections (cross-points) of the transmitting conductors $12Y_1, 12Y_2, \ldots, 12Y_{46}$ and the receiving conductors $11X_1, 11X_2, \ldots, 11X_{72}$, is detected about the respective cross-points. This can identify the cross-point at which the capacitance has changed in association with approach or touch of an indicator such as a finger to the sensor section 100.

The position detecting device 1 has a configuration in which the received signals from the respective receiving conductors $11X_1$ to $11X_{72}$ are supplied to a signal processing circuit 31 and each of the received signals from the receiving conductors $11X_1$ to $11X_{72}$ is simultaneously subjected to A/D conversion. Furthermore, as described in detail later, the signal processing circuit 31 receives the signal from each of the receiving conductors $11X_1$ to $11X_{72}$ in the form of a current and converts it to a voltage signal to subject it to analog/digital (A/D) conversion by a multiple-integral analog digital converter (ADC). The multiple-integral ADC is to convert the charge accumulated in the capacitor to a digital signal corresponding to the charge accumulated in the capacitor by sequentially performing discharge and charge of the capacitor by using plural reference currents having different values.

A position detecting circuit 32 calculates correlation calculation values by performing correlation calculation using signals (codes) corresponding to the transmission signals (transmission codes) supplied from the transmission signal generating circuit 21 to the respective transmitting conductors $12Y_1, 12Y_2, \ldots, 12Y_{46}$. For this purpose, signals used for the correlation calculation (correlation calculation signals) are supplied from the transmission signal generating circuit 21 to the position detecting circuit 32. Then, the position detecting circuit 32 operates in accordance with control of the control circuit 400 to detect the position indicated by an indicator such as a finger on the sensor section 100 based on the calculated correlation calculation values. Output data according to the indicated position by the indicator is supplied to a display controller (not shown) or the like provided in the portable apparatus for example. Thereby, displaying according to the indicated position by the indicator is made on the display screen.

The position detecting device 1 of this embodiment having such a configuration simultaneously supplies the transmission signal to each of 46 transmitting conductors $12Y_1$ to $12Y_{46}$ and simultaneously processes the received signals from 72 receiving conductors $11X_1$ to $11X_{72}$. Furthermore, it detects the position indicated by an indicator on the indication input surface 100S based on the indication state of the indicator at 3312 cross-points formed by 46 transmitting conductors $12Y_1$ to $12Y_{46}$ and 72 receiving conductors $11X_1$ to $11X_{72}$.

Hereinafter, each of the receiving conductors $11X_1$ to $11X_{72}$ will be described as the receiving conductor 11X collectively and each of the transmitting conductors $12Y_1$ to $12Y_{46}$ will be described as the transmitting conductor 12Y collectively except for the case of particularly describing an individual conductor.

Figure 3:
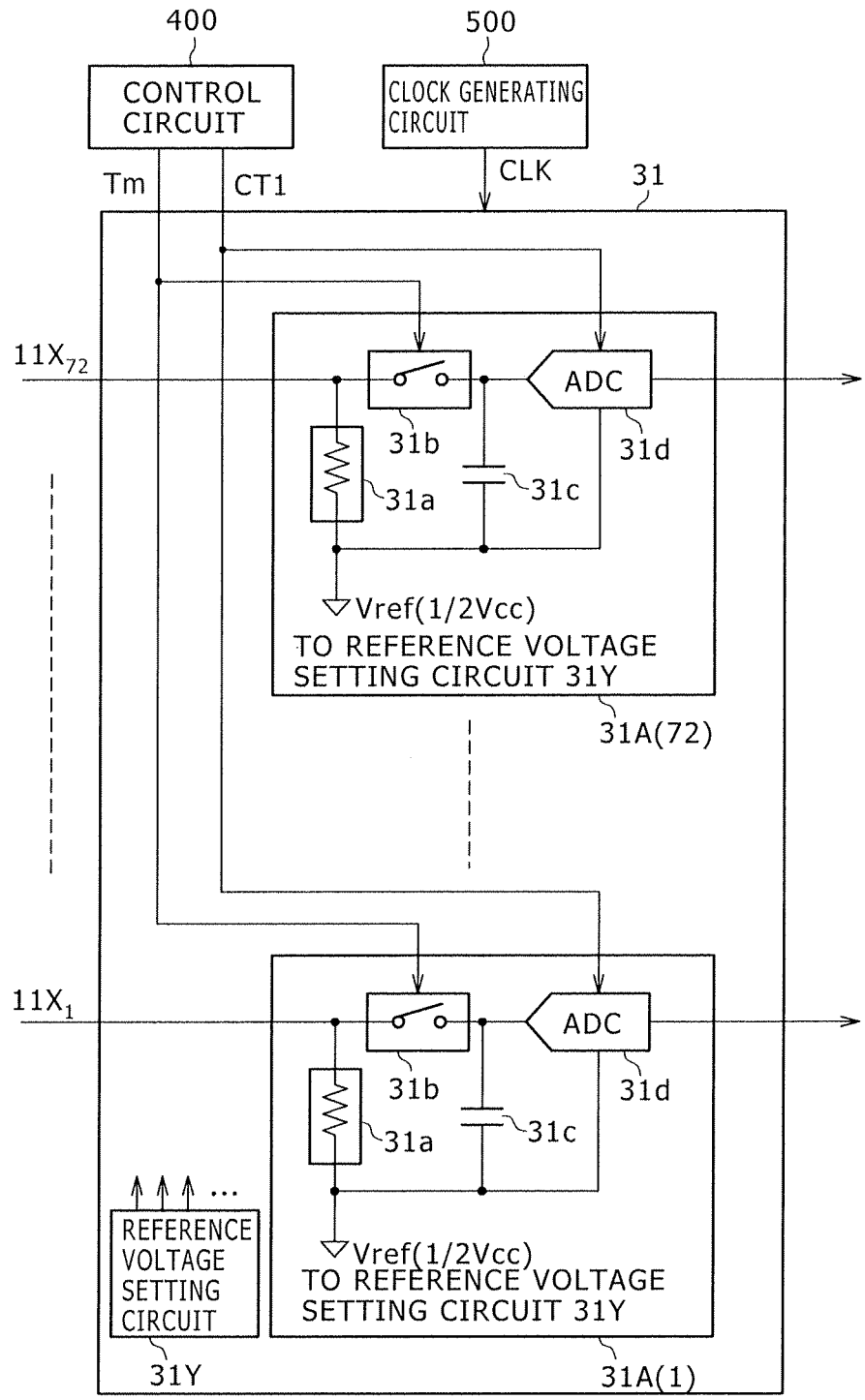
FIG. 3 is a diagram for explaining a configuration example of a signal processing circuit of a first embodiment of this invention.

Specific Configuration Example of Signal Processing Circuit 31 of First Embodiment FIG. 3 is a diagram for explaining a configuration example of the signal processing circuit 31 used in the position detecting device 1 of the first embodiment. As shown in FIG. 3, the signal processing circuit 31 of the first embodiment includes 72 signal processing circuits 31A(1) to 31A(72) corresponding to 72 receiving conductors $11X_1$ to $11X_{72}$, respectively. Each of 72 signal processing circuits 31A(1) to 31A(72) has the same configuration. Therefore, hereinafter, the signal processing circuits 31A(1) to 31A(72) will be described as the signal processing circuit 31A collectively except for the case of particularly describing an individual circuit.

In the signal processing circuit 31A shown in FIG. 3, one terminal of a clamp circuit 31a configured by a resistive element is connected to the receiving conductor 11X. Furthermore, one terminal of a gate circuit 31b is also connected to the receiving conductor 11X. One terminal of a capacitor circuit 31c is connected to the other terminal of the gate circuit 31b. The other terminal of the clamp circuit 31a and the other terminal of the capacitor circuit 31c are set to a predetermined potential. In FIG. 3, they are connected to a reference voltage setting circuit 31Y and thereby the predetermined potential is set. A voltage generated at said one terminal of the capacitor circuit 31c is converted to a digital signal by an ADC 31d.

Specifically, the clamp circuit 31a clamps the receiving conductor to a predetermined potential as described in detail below. The gate circuit 31b connects the receiving conductor clamped to the predetermined potential by the clamp circuit 31a to the capacitor circuit 31c. The capacitor circuit 31c accumulates a charge corresponding to the predetermined potential set through the clamping of the receiving conductor by the clamp circuit 31a via the gate circuit 31b. The voltage generated in the capacitor circuit 31c in association with the change accumulated in the capacitor circuit 31c is converted to the digital signal by the ADC 31d.

In FIG. 3, the reference voltage setting circuit 31Y is provided in the signal processing circuit 31 for simplification of explanation. However, the reference voltage setting circuit 31Y does not need to be provided in the signal processing circuit 31. It suffices that the configuration is so made that the other terminal of the clamp circuit 31a and the other terminal of the capacitor circuit 31c are set to the desired potential.

Therefore, in this embodiment, because a single power supply to which a supply voltage Vcc is supplied is used, a reference voltage (Vref) set by the reference voltage setting circuit 31Y is set to half the supply voltage Vcc (½·Vcc) so that both the rising and falling of the received signal can be surely detected. In brief, if the transmission signal is "1," the voltage generated in the capacitor circuit 31c is larger than the reference voltage (½·Vcc). Conversely, if the transmission signal is "0," the voltage generated in the capacitor circuit 31c is smaller than the reference voltage (½·Vcc). In this manner, the configuration is so made that voltage change can be generated with a proper signal level in the capacitor circuit 31c whether the transmission signal is "1" or "0."

That is, in the case of the signal processing circuit driven by a power supply to which supply voltages±Vcc can be simultaneously supplied, it is also possible to set the reference voltage (Vref) to zero volts. Thus, in this case, the reference voltage setting circuit 31Y is unnecessary or means wiring connection that merely grounds the other terminal of each of the clamp circuit 31a and the capacitor circuit 31c to thereby set the potential thereof to zero volts. Although the signal processing circuit 31 shown in FIG. 3 is so configured that the same reference voltage (½·Vcc) is set for not only the clamp circuit 31a and the capacitor circuit 31c but also the ADC 31d, each of them does not need to be set to the same potential.

However, if they are electrically connected to each other to be set to the same potential as shown in FIG. 3, each of the clamp circuit 31a, the capacitor circuit 31c, and the ADC 31d is affected by the same voltage variation when variation in the reference voltage occurs. Therefore, there is an advantage that the influence of the voltage variation is substantially eliminated among the clamp circuit 31a, the capacitor circuit 31c, and the ADC 31d.

Figure 4:
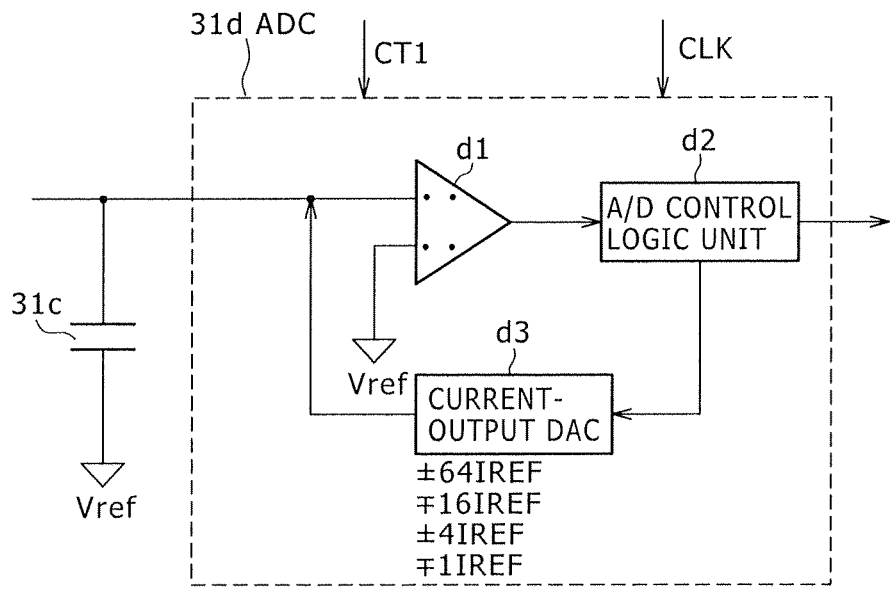
FIG. 4 is a diagram for explaining a configuration example of an A/D converter suitable to be used with this invention.
Figure 5:
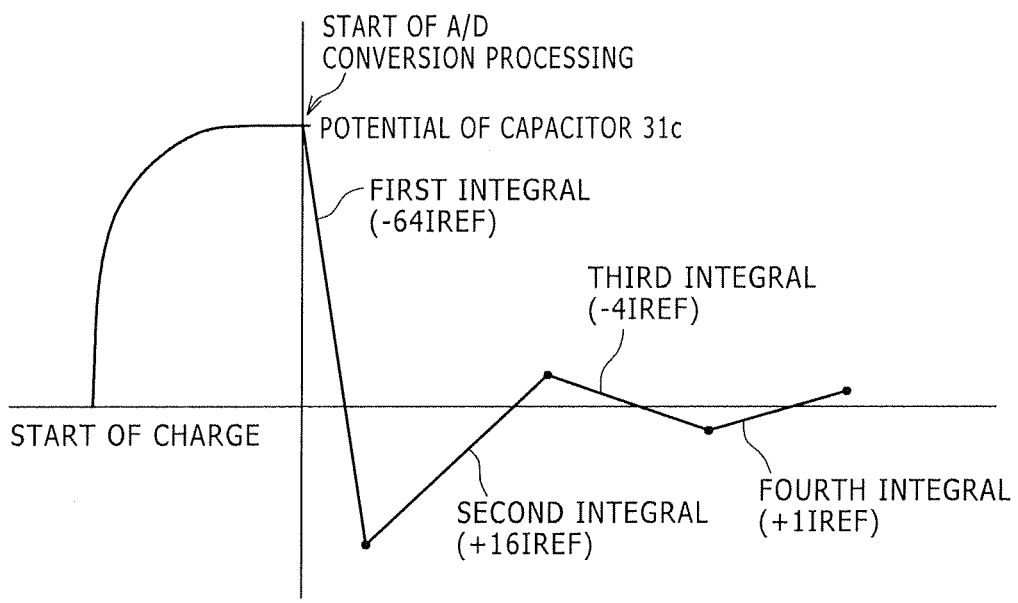
FIG. 5 is a diagram for conceptually explaining the operation of the A/D converter suitable to be used with this invention.

The ADC 31d used in the signal processing circuit 31A of the first embodiment is a multiple-integral ADC. FIG. 4 is a diagram for explaining a configuration example of the ADC 31d used in the first embodiment. FIG. 5 is a diagram for conceptually explaining the operation of the ADC 31d. As shown in FIG. 4, the ADC 31d of the first embodiment includes a comparator d1, an A/D control logic unit d2, and a current-output digital/analog converter (DAC) d3.

Also as described later, with the reference voltage (Vref) serving as the reference potential, a charge as the received signal supplied from the receiving conductor 11X is supplied to the capacitor circuit 31c of the signal processing circuit 31A for predetermined time. Thereby, a potential according to the charge is generated and held in the capacitor circuit 31c. This potential held by the capacitor circuit 31c is converted to a digital signal by the ADC 31d. The outline of the A/D conversion processing executed in the ADC 31d is as follows.

Specifically, in the ADC 31d, a reference current (64IREF to 1IREF shown in FIG. 4) from the current-output DAC d3 is supplied to between the capacitor circuit 31c and the comparator d1 configuring the ADC 31d. This reference current is so set as to cancel the charge held in the capacitor circuit 31c. Due to this, processing of performing inversion integral of this reference current in the capacitor circuit 31c is executed. Through this inversion integral processing, a digital signal corresponding to the charge held in the capacitor circuit 31c is generated.

In this case, the potential that is generated in the capacitor circuit 31c and changes due to the inversion integral processing by use of the reference current IREF is compared with the reference voltage Vref by the comparator d1. The comparison result is supplied to the A/D control logic unit d2 and it is detected whether or not the polarity of the potential generated in the capacitor circuit 31c has been switched. In the ADC 31d, the series of processing of inversion integral→comparison→polarity inversion detection is repeated and thereby the A/D control logic unit d2 measures the processing time corresponding to the charge held in the capacitor circuit 31c. The A/D control logic unit d2 includes a counter that operates based on the clock signal CLK, a controller that controls e.g., the reset timing of this counter and the output timing of a count value, and so forth although not shown in the diagram.

Next, the A/D conversion processing executed in the multiple-integral ADC 31d shown in FIG. 4 will be described in detail. The example of FIG. 4 is based on the assumption that the receiving conductor set to a positive potential by the clamp circuit 31a is connected to the capacitor circuit 31c and the positive potential is generated in the capacitor circuit 31c. Furthermore, the ADC 31d executes fourfold integral processing and a predetermined reference current is set in the current-output DAC d3 based on control of the A/D control logic unit d2.

A reference current that is −64 times the base current (IREF) is output from the current-output DAC d3 so that the charge held in the capacitor circuit 31c may be cancelled, i.e., the polarity of the potential generated in the capacitor circuit 31c may become the reverse polarity, to perform inversion integral until the polarity of the potential generated in the capacitor circuit 31c is inverted. Furthermore, the time of the inversion integral is measured by the A/D control logic unit d2 and time data obtained by multiplying this measured time by 64 is retained in a memory.

Next, upon detection of the inversion of the polarity of the potential generated in the capacitor circuit 31c by the A/D control logic unit d2, the current-output DAC d3 outputs a reference current that is +16 times the base current to perform inversion integral until the polarity of the potential generated in the capacitor circuit 31c is inverted again based on control of the A/D control logic unit d2. The time of the inversion integral is measured by the A/D control logic unit d2 and time data obtained by multiplying this measured time by 16 is added to the time data already retained in the memory and the resulting data is retained.

Next, upon detection of the inversion of the polarity of the potential generated in the capacitor circuit 31c by the A/D control logic unit d2, the current-output DAC d3 outputs a reference current that is −4 times the base current to perform inversion integral until the polarity of the potential generated in the capacitor circuit 31c is inverted again based on control of the A/D control logic unit d2. The time of the inversion integral is measured by the A/D control logic unit d2 and time data obtained by multiplying this measured time by 4 is added to the time data already retained in the memory and the resulting data is retained.

At last, upon detection of the inversion of the polarity of the potential generated in the capacitor circuit 31c by the A/D control logic unit d2, the current-output DAC d3 outputs a reference current that is +1 times the base current to perform inversion integral until the polarity of the potential generated in the capacitor circuit 31c is inverted again based on control of the A/D control logic unit d2. The time of the inversion integral is measured by the A/D control logic unit d2 and this measured time is added to the time data already retained in the memory and the resulting data is retained.

In this manner, the series of integral processing is repeatedly executed and the time data retained in the memory is read out at the completion timing of the processing. Thereby, the predetermined potential generated in the capacitor circuit 31c due to the connection of the receiving conductor set to the predetermined potential by the clamp circuit 31a to the capacitor circuit 31c is converted to the corresponding digital signal. It is apparent that a reference current that is 64 times the initial base current (IREF) is output from the current-output DAC d3 if the receiving conductor is set to a negative potential by the clamp circuit 31a and the negative potential is generated in the capacitor circuit 31c.

In this first embodiment, as shown in FIG. 3, the gate circuit 31b of each signal processing circuit 31A is on/off-controlled (open/close-controlled) by a timing signal Tm for the gate circuit 31b from the control circuit 400. The timing signal Tm for the gate circuit 31b is a signal synchronized with the clock signal CLK from the clock generating circuit 500. As for the ADC 31d, operation/non-operation is controlled by a timing signal CT1 for the ADC 31d from the control circuit 400 also as described above and also as shown in FIG. 2.

The ADC that converts the potential generated in the capacitor circuit 31c configuring the signal processing circuit 31A of the embodiment of the present invention to the digital signal is not limited to the above-described integral ADC. However, if the above-described signal processing circuit 31A is combined with the integral ADC 31d, the integral ADC 31d can output the digital signal corresponding to the charge held in the capacitor circuit 31c configuring the signal processing circuit 31A by cancelling the charge held in the capacitor circuit 31c by the predetermined reference current. That is, the capacitor circuit 31c configuring the signal processing circuit 31A functions also as a constituent element of the integral ADC 31d and this combination is suitable in the case of integrally configuring the signal processing circuit 31A and the integral ADC 31d as an integrated circuit.

Outline of Operation of Signal Processing Circuit 31A

Figure 6:
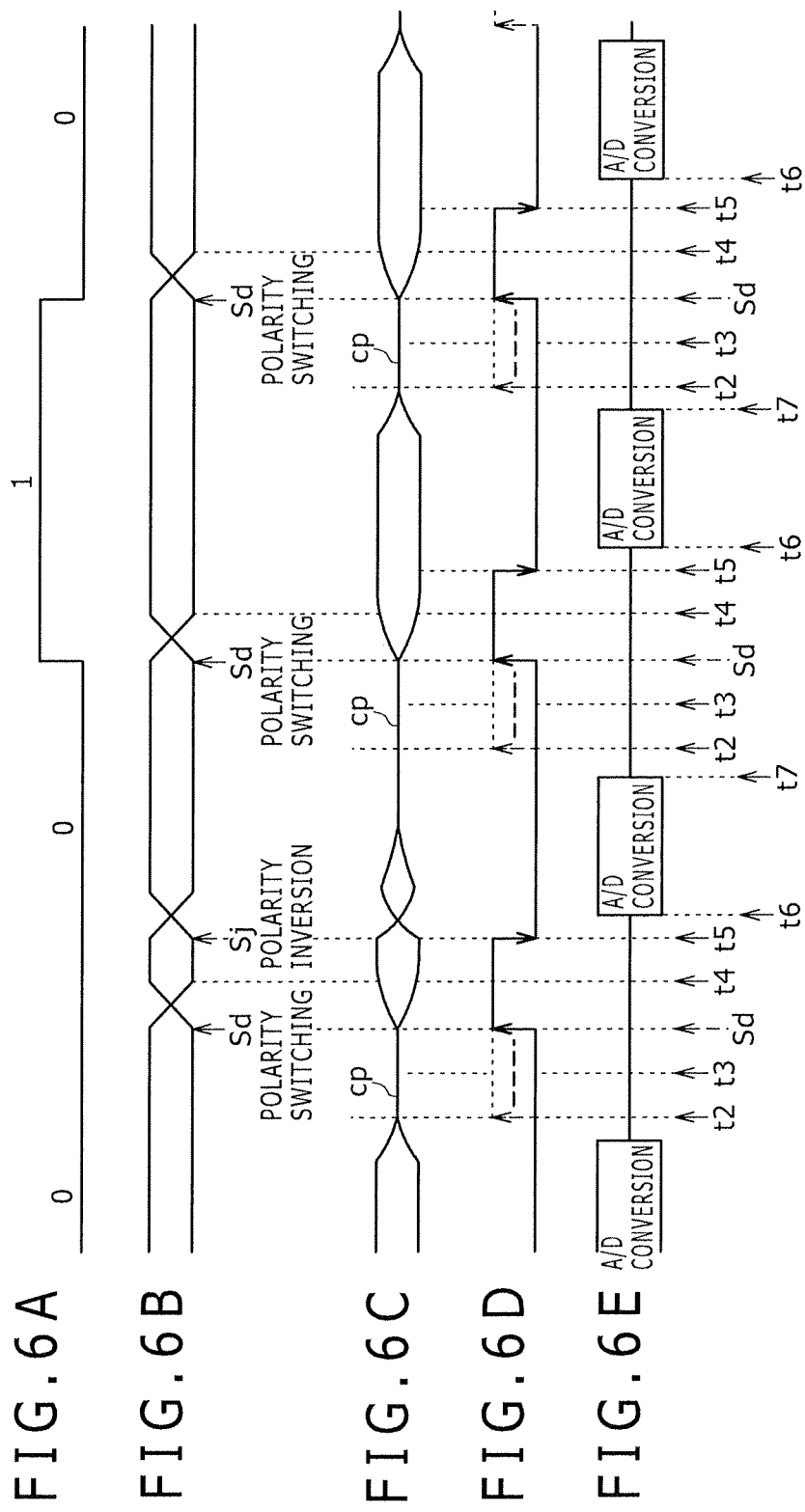
FIGS. 6A-6E are timing charts for explaining the operation of the signal processing circuit of the first embodiment of this invention.

The outline of the operation of each signal processing circuit 31A configuring the signal processing circuit 31 will be described below. FIGS. 6A-6E (collectively FIG. 6) are timing charts for explaining the operation of the signal processing circuit 31A of the first embodiment. FIG. 6A shows a specific example of the transmission signal (transmission code) generated in the transmission signal generating circuit 21. FIG. 6B shows the state of the signal supplied to the transmitting conductor 12Y via the transmission signal generating circuit 21 and the signal polarity inverting circuit 22. FIG. 6C shows the state of the signal in the capacitor circuit 31c to which the received signal received from the receiving conductor 11X connected to the clamp circuit 31a is supplied via the gate circuit 31b configuring the signal processing circuit 31A.

As shown in FIG. 6A, in this example, the signal supplied to the transmitting conductor 12Y (transmission code) is e.g., "0010." If "0" is consecutive or conversely "1" is consecutive like the transmission signal of this example, the rising or falling of the transmission signal cannot be properly set and change in the capacitance corresponding to change in the signal level of the transmission signal cannot be caused in the capacitor circuit 31c. Therefore, to adjust the polarity (high level/low level) of the transmission signal prior to signal transmission to the transmitting conductor 12Y, the signal polarity inverting circuit 22 controlled by the control circuit 400 is provided.

Specifically, normally a signal of a signal level corresponding to the signal level of the transmission signal (transmission code) shown in FIG. 6A is supplied to the transmitting conductor 12Y. The timing at which the signal level of the transmission signal can change is represented as timing Sd. For example, if the signal level of the signal supplied to the transmitting conductor 12Y is at the low level when the transmission signal is "0" and the signal level of the signal supplied to the transmitting conductor 12Y is at the high level when the transmission signal is "1," at the timing Sd when the transmission signal changes from "0" to "1" in FIG. 6A, the signal level of the signal supplied to the transmitting conductor 12Y is switched from the low level to the high level as shown in FIG. 6B. Similarly, at the timing Sd when the transmission signal changes from "1" to "0" in FIG. 6A, the signal level of the signal supplied to the transmitting conductor 12Y is switched from the high level to the low level as shown in FIG. 6B.

However, if "0" is consecutive after "0" in the transmission signal or "1" is consecutive after "1" in the transmission signal, the signal level of the signal supplied to the transmitting conductor 12Y is temporarily inverted by the signal polarity inverting circuit 22 controlled by the control circuit 400.

Specifically, if "0" is consecutive after "0" in the transmission signal at the timing Sd in FIG. 6A, the signal level of the signal supplied to the transmitting conductor 12Y is temporarily switched to the high level but processing of setting the signal level to the low level again is executed at timing Sj as shown in FIG. 6B. In this manner, the configuration is so made that, if "0" is consecutive in the transmission signal or conversely "1" is consecutive, the signal level of the signal supplied to the transmitting conductor 12Y is temporarily inverted so that change in the capacitance is caused in the capacitor circuit 31c although "0" is consecutive in the transmission signal or "1" is consecutive in the transmission signal. Although the signal level is set to the low level in association with the transmission signal "0" in this example, obviously it is also possible to set the signal level to the high level in association with the signal level "0."

That is, as shown in FIG. 6B, in principle, the signal level (or polarity) of the signal supplied to the transmitting conductor 12Y is so set as to correspond to the state of the transmission signal from the transmission signal generating circuit 21, i.e., "0" or "1," at the timing Sd, when the state of the transmission signal can change. However, if consecutive "0" or consecutive "1" exists in the transmission signal, by the signal polarity inverting circuit 22, the signal level of the signal supplied to the transmitting conductor 12Y is switched at the timing Sd and the signal level of the signal supplied to the transmitting conductor 12Y is so switched as to be returned to the original level at the timing Sj, which is after the elapse of predetermined time from the timing Sd.

The potential generated in the capacitor circuit 31c configuring the signal processing circuit 31A connected to the receiving conductor 11X according to the signal supplied to the transmitting conductor 12Y has a signal level like that shown in FIG. 6C substantially due to the clamp circuit 31a and the gate circuit 31b of the signal processing circuit 31A explained by using FIG. 3. Specifically, as shown by the linear part indicated by a symbol cp in FIG. 6C, the receiving conductor 11X is clamped to the reference voltage Vref (Vref=½·Vcc) by the clamp circuit 31a in a predetermined period preceding the timing Sd, when the signal level of the transmission signal is switched.

Furthermore, as shown in FIG. 6C, the received signal according to the signal supplied to the transmitting conductor 12Y is supplied to the signal processing circuit 31A connected to the receiving conductor 11X. Specifically, the receiving conductor 11X clamped to the reference voltage Vref by the clamp circuit 31a is connected to the capacitor circuit 31c via the gate circuit 31b. Thereby, a potential that is according to the received signal and has a signal level varying with respect to the reference voltage Vref as the center potential is generated in the capacitor circuit 31c. Then, the potential of the capacitor circuit 31c is converted to a digital signal by the above-described ADC 31d.

For this purpose, in each signal processing circuit 31A of the first embodiment, the gate circuit 31b is controlled by the timing signal Tm for the gate circuit 31b shown in FIG. 6D. In the first embodiment, the gate circuit 31b is turned on after the end of A/D conversion processing as shown in FIG. 6D, and in the state in which the receiving conductor 11X has been clamped by the clamp circuit 31a and the signal level has been set to the reference voltage Vref as shown in FIG. 6C. Although it is switched on at the timing Sd in the example of FIG. 6D, the switch timing is not limited thereto. It is enough that it is switched in the period of cp from timing t2 to the timing Sd.

When the gate circuit 31b is turned on (closed state) by the timing signal Tm, the receiving conductor 11X in which the signal level is set to the reference voltage Vref through clamping by the clamp circuit 31a receives a signal corresponding to the signal level of the signal supplied to the transmitting conductor 12Y and a charge is supplied to the capacitor circuit 31c, so that the potential of the capacitor circuit 31c changes.

Then, the gate circuit 31b turned on by the timing signal Tm at the timing Sd is turned off (open state) at timing t5 that is the same as or precedes the timing Sj, when the signal level of the signal supplied to the transmitting conductor 12Y can be switched. By switching the gate circuit 31b to the off-state (open state), a potential corresponding to the signal level of the received signal is held in the capacitor circuit 31c.

For the potential held in the capacitor circuit 31c, A/D conversion processing is started by the ADC 31d at timing t6 after the timing t5 and ends at timing t7, and a digital signal corresponding to the potential held in the capacitor circuit 31c is output. The ADC 31d is so controlled as to operate at operation timing shown in FIG. 6E by the timing signal CT1 for the ADC 31d. Each of the timings t2, t3, t4, t5, Sd, and Sj is set based on the clock signal CLK generated by the clock generating circuit 500.

Second Embodiment

A second embodiment of the signal processing circuit and the signal processing method of this invention will be described below. The signal processing circuit and the signal processing method of this second embodiment are also applied to the position detecting device 1 of electronic apparatus such as the smartphone as explained by using FIG. 1. In this second embodiment, the configuration of the signal processing circuit 31 of the position detecting device 1, whose configuration example is shown in FIG. 3, is different from that of the first embodiment.

Specifically, in the respective signal processing circuits 31A(1) to 31A(72) of the signal processing circuit 31 of the above-described first embodiment, a resistive element is used as the clamp circuit 31a for setting the receiving conductor to the predetermined reference voltage. Therefore, a certain amount of time is necessary until the voltage of the receiving conductor 11X is stably clamped to the reference voltage. So, in a signal processing circuit 31X of this second embodiment, a switch circuit is used as the clamp circuit 31a to thereby shorten the necessary time until the receiving conductor 11X is clamped to the predetermined reference voltage.

Figure 7:
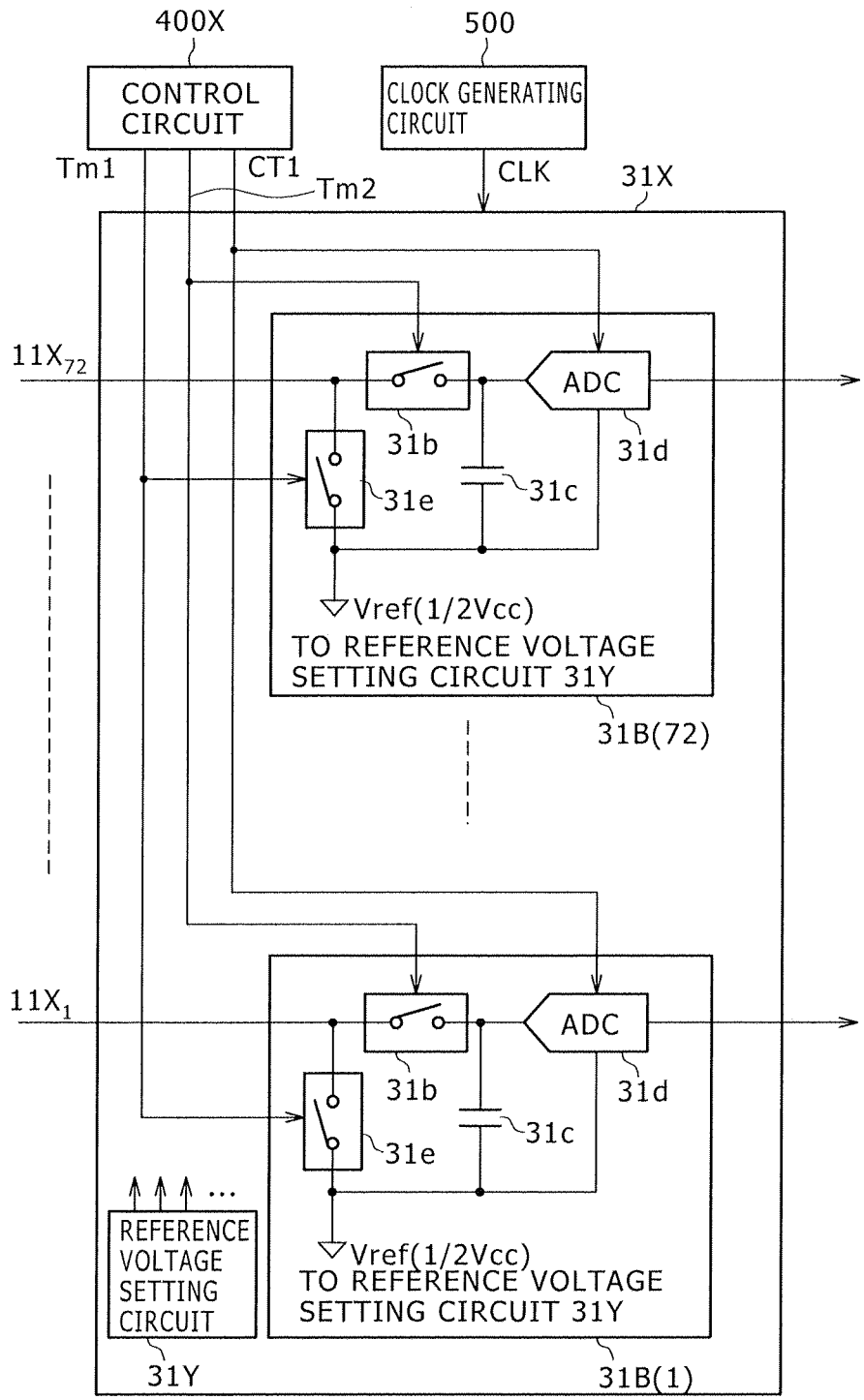
FIG. 7 is a diagram for explaining a configuration example of a signal processing circuit of a second embodiment of this invention.

Specific Configuration Example of Signal Processing Circuit 31X of Second Embodiment FIG. 7 is a diagram for explaining a configuration example of the signal processing circuit 31X of the second embodiment. The signal processing circuit 31X shown in FIG. 7 corresponds to the signal processing circuit 31 of the position detecting device 1 shown in FIG. 3. The signal processing circuit 31X of the second embodiment shown in FIG. 7 includes 72 signal processing circuits 31B(1) to 31B(72) corresponding to 72 receiving conductors $11X_1$ to $11X_{72}$, respectively. Each of 72 signal processing circuits 31B(1) to 31B(72) has the same configuration. Therefore, hereinafter, the signal processing circuits 31B(1) to 31B(72) will be described as the signal processing circuit 31B collectively except for the case of particularly describing an individual circuit.

As is understood from comparison between FIGS. 3 and 7, the signal processing circuit 31B of the second embodiment is different from the signal processing circuit 31A of the first embodiment in that a switch circuit 31e is used as the clamp circuit. Furthermore, the signal processing circuit 31B has a configuration in which the switch circuit 31e as the clamp circuit is controlled by a timing signal Tm1 from a control circuit 400X. This control circuit 400X corresponds to the control circuit 400 shown in FIG. 2 and is different from the control circuit 400 of the first embodiment in that it forms the timing signal Tm1 for the switch circuit 31e supplied to the switch circuit 31e in addition to a timing signal Tm2 corresponding to the timing signal Tm for the gate circuit 31b in the first embodiment.

Except for these points, the second embodiment has the same configuration as that of the first embodiment. Therefore, regarding the signal processing circuit 31X of this second embodiment and its peripheral part, the same reference numerals are given to the parts having the same configurations as those in the first embodiment and detailed description of them is omitted.

Specifically, in the signal processing circuit 31B of the second embodiment, one terminal of the switch circuit 31e as the clamp circuit and one terminal of the gate circuit 31b are connected to the receiving conductor 11X as shown in FIG. 7. The other terminal of the switch circuit 31e and the other terminal of the capacitor circuit 31c are connected to the reference voltage setting circuit 31Y similarly to the first embodiment. Furthermore, the signal processing circuit 31B includes the ADC 31d that converts a potential generated in the capacitor circuit 31c to a digital signal as shown in FIG. 7.

That is, on/off-operation of the switch circuit 31e shown in FIG. 7 is controlled by the timing signal Tm1 as described in detail below and the switch circuit 31e immediately clamps the receiving conductor to the reference voltage Vref differently from the resistive element serving as the clamp circuit 31a shown in FIG. 3.

Outline of Operation of Signal Processing Circuit 31B of Second Embodiment

The outline of the operation of each signal processing circuit 31B configuring the signal processing circuit 31X of the second embodiment will be described below. FIGS. 8A-8E (collectively FIG. 8) are timing charts for explaining the operation of the signal processing circuit 31B of the second embodiment. In FIG. 8, signals shown in FIG. 8A, FIG. 8B, and FIG. 8C are the same as the signals shown in FIG. 6A, FIG. 6B, and FIG. 6C, respectively, in FIG. 6. However, as shown in FIG. 8B, in the second embodiment, the timing Sj indicating the timing when the polarity of the transmission signal is inverted can be set at later timing than the timing Sj in the first embodiment shown in FIG. 6B.

This is because of the following reason. In the first embodiment, it takes a long time to stably clamp the potential of the receiving conductor 11X to the reference voltage Vref because the clamp circuit 31a having the resistive element configuration is used. In contrast, in the second embodiment, the clamp circuit having the configuration of the switch circuit 31e is used and thus the potential of the receiving conductor 11X can be rapidly clamped to the reference voltage Vref. This eliminates the need to set the timing Sj indicating the timing when the polarity of the transmission signal is inverted at a position close to the transmission timing Sd of the transmission signal. In FIG. 8, timing t0 indicates the timing corresponding to the timing Sj, which indicates polarity inversion timing when the polarity of the transmission signal needs to be inverted.

In this second embodiment, switching control of the switch circuit 31e of each signal processing circuit 31B is carried out by the timing signal Tm1 for the switch circuit 31e from the control circuit 400X as shown in FIG. 7. As shown in FIG. 8F, the switch circuit 31e is turned on after the start of A/D conversion processing. Due to this, the receiving conductor 11X is connected to the reference voltage setting circuit 31Y and the potential of the receiving conductor 11X can be rapidly clamped to the reference voltage Vref as shown in FIG. 8C. Although the switch circuit 31e is turned on at timing t1 in the example of FIG. 8F, the turning-on timing is not limited thereto. It is enough that it is switched on in the period from the start timing t6 of A/D conversion to the end timing t7 of the A/D conversion.

The switch circuit 31e is turned off before the timing Sd as the next transmission operation timing as shown in FIG. 8F. Thereby, the processing of clamping the potential of the receiving conductor 11X to the reference voltage Vref is completed. Although the switch circuit 31e is turned off at timing t3 in the example of FIG. 8F, the turning-off timing is not limited thereto. It is enough that it is switched off at timing before the timing Sd as the next transmission operation timing.

The gate circuit 31b of each signal processing circuit 31B of the second embodiment is controlled by the timing signal Tm2 for the gate circuit 31b shown in FIG. 8D. Basically the timing signal Tm2 for the gate circuit 31b shown in FIG. 8D provides the same timing as that by the timing signal Tm for the gate circuit 31b of each signal processing circuit 31A of the first embodiment shown in FIG. 6D. However, in the second embodiment, because the switch circuit 31e having the switch circuit configuration is used, it is enough that the gate circuit 31b is switched in the period of cp from timing t2' that is after the end of A/D conversion processing and when the potential of the receiving conductor 11X becomes stable after being clamped to the reference voltage Vref to the timing Sd. That is, the timing signal Tm2 (FIG. 8D) for the gate circuit 31b used in the second embodiment can turn on the gate circuit 31b at the timing t2' earlier than the timing t2 of the timing signal Tm (FIG. 6D) for the gate circuit 31b used in the first embodiment.

As shown in FIG. 8E, the start timing and end timing of A/D conversion processing by the ADC 31d are the same as those of A/D conversion processing by the ADC 31d of the first embodiment, shown in FIG. 6E. Each of the timings t0, t1, t2', t3, t4, t5, t6, t7, Sd, and Sj is set based on the clock signal CLK generated by the clock generating circuit 500.

As above, in the case of the signal processing circuit 31B of the second embodiment, the potential of each receiving conductor 11X is rapidly clamped to the reference voltage Vref by using the clamp circuit having the configuration of the switch circuit 31e. Thereafter, for the potential held in the capacitor circuit 31c according to the received signal, A/D conversion processing is started by the ADC 31d at the timing t6 after the timing t5 and the A/D conversion processing ends at the timing t7, so that a digital signal corresponding to the potential held in the capacitor circuit 31c can be output.

In the signal processing circuit 31B of the second embodiment shown in FIG. 7, a period in which both the switch circuit 31e and the gate circuit 31b are in the on-state can be set, as is understood also from FIGS. 8F and 8D. If the period in which both the switch circuit 31e and the gate circuit 31b are in the on-state is set in this manner, with clamping of the potential of the receiving conductor 11X to the reference voltage Vref, the potential of the capacitor circuit 31c (held potential) can also be simultaneously set to the reference voltage Vref. In this manner, the potential of the capacitor circuit 31c can be made a potential according to the received signal after the potential of the capacitor circuit 31c is set to a predetermined potential always. In this case, it is possible to hold the received signal from the receiving conductor 11X as a difference voltage value relative to the reference voltage Vref set in the capacitor circuit 31c in advance, and subject it to A/D conversion.

In this second embodiment, it is preferable that the switch circuit 31e be so controlled as to slowly perform switching from the off-state to the on-state and rapidly perform switching from the on-state to the off-state. The reason why the switch circuit 31e is slowly turned on as above is as follows. As is understood also from FIG. 8, possibly A/D conversion processing is still under execution at the turning-on timing of the switch circuit 31e. Therefore, the switch circuit 31e is slowly turned on to avoid a situation in which a large current flows to the reference voltage setting circuit 31Y when the switch circuit 31e is turned on and variation in the reference voltage (Vref) is caused to obstruct the A/D conversion processing in the ADC 31d. The reason why the switch circuit 31e is rapidly turned off is because possibly the level of the clamped voltage in the receiving conductor 11X (clamp level) varies unless the switch circuit 31e is turned off by the polarity switching timing Sd, when the signal level of the transmission signal is switched.

Effects of Embodiments

The position detecting device 1 of the above-described embodiments has the configuration in which the received signals from the respective receiving conductors 11X are supplied directly to the signal processing circuit 31 (31X) as shown in FIG. 2. Therefore, power consumption saving can be achieved from not having to use an I-V conversion circuit (current-voltage conversion circuit) configured by using an operational amplifier and so forth differently from the position detecting device of the related art.

Furthermore, because the conventional I-V conversion circuit is not used, the circuit scale can be reduced and configuring an IC is made easy, so that further size reduction and weight reduction are allowed. Specifically, when a capacitor is used for I-V conversion, the capacitance value tends to be large. In contrast, a capacitor to which the receiving conductor clamped to the reference potential by the clamp circuit is connected via the gate circuit can provide a small capacitance value because of difference in the circuit configuration. This reduces the circuit scale and facilitates configuring an IC to allow further size reduction and weight reduction.

Moreover, because of having the small circuit scale, the signal processing circuit of the present invention can be connected to each of all receiving conductors to execute A/D conversion processing. Thus, desirable detection characteristics of the indicated position can be achieved.

Modification Examples

Although it is explained that the multiple-integral ADC 31d is used in the above-described embodiments, the configuration is not limited thereto. As the ADC 31d, an ADC of an integral type, a successive approximation type, or any of other various systems can be used.

In the above-described embodiments, mainly the signal processing circuits 31 and 31X and the control circuits 400 and 400X serve as the major part thereof. However, for example, it is also possible to configure only the signal processing circuit 31 or 31X as an IC or configure the part composed of the signal processing circuit 31 or 31X and the control circuit 400 or 400X as an IC. Furthermore, it is also possible to configure the part composed of the signal processing circuit 31 or 31X and the position detecting circuit 32, i.e., the receiving section 300, as an IC. Moreover, it is also possible to configure the part composed of the receiving section 300 and the control circuit 400 or 400X as an IC.

In addition, it is also possible to configure the part composed of the transmitting section 200 and the signal processing circuit 31 or 31X as an IC. Furthermore, it is also possible to configure the part composed of the transmitting section 200 and the receiving section 300 as an IC and configure the part obtained by adding the control circuit 400 or 400X to them as an IC. That is, in the position detecting device 1 shown in FIG. 2, it is possible to arbitrarily combine units except the sensor section 100 with each other and configure them as an IC.

The method in which the ADC 31d is controlled with control of at least the gate circuit 31b as explained by using FIG. 5 in the signal processing circuit 31 having the configuration described in FIG. 3 or as explained by using FIG. 8 in the signal processing circuit 31X having the configuration described in FIG. 7 corresponds to the method of this invention.

In the above-described embodiments, because a single power supply is used, the case in which the reference voltage is set to half the positive supply voltage Vcc is explained as a preferable example. However, the configuration is not limited thereto. The reference voltage may be 0 (zero) V (volts) or GND (ground) if a configuration using positive and negative power supplies is employed or a circuit for a single power supply requiring no reference voltage is used.

In the above-described embodiments, the open operation of the gate circuit carried out at the timing t5 may be simultaneous with the A/D conversion start operation carried out at the timing t6, and they may be carried out simultaneously with the polarity inversion timing Sj. It is also possible to synchronize the clamp start operation carried out at the timing t1 with the A/D conversion end operation carried out at the timing t7 or synchronize the close operation of the gate circuit carried out at the timing t2 or t2' with the A/D conversion end operation carried out at the timing t7.

The explanation of the above-described embodiments is made by taking as an example the case in which the number of transmitting conductors 12Y is 46 and the number of receiving conductors 11X is 72. However, the configuration is not limited thereto. The numbers of transmitting conductors 12Y and receiving conductors 11X can be set to arbitrary numbers.

DESCRIPTION OF REFERENCE SYMBOLS

1 . . . Position detecting device, 100 . . . Sensor section, 100S . . . Indication input surface, 11 . . . Receiving conductor group, $11X_1$ to $11X_{72}$ . . . Receiving conductor, 12 . . . Transmitting conductor group, $12Y_1$ to $12Y_{46}$ . . . Transmitting conductor, 200 . . . Transmitting section, 21 . . . Transmission signal generating circuit, 22 . . . Signal polarity inverting circuit, 300 . . . Receiving section, 31, 31X . . . Signal processing circuit, 31A(1) to 31A(72) . . . Signal processing circuit, 31B(1) to 31B(72) . . . Signal processing circuit, 31a . . . Clamp circuit, 31b . . . Gate circuit, 31c . . . Capacitor circuit, 31d . . . ADC, 31e . . . Switch circuit, d1 . . . Comparator, d2 . . . A/D control logic unit, d3 . . . Current-output DAC, 31Y . . . Reference voltage setting circuit, 32 . . . Position detecting circuit, 400, 400X . . . Control circuit, 500 . . . Clock generating circuit, 2 . . . Electronic apparatus, 2D . . . Display screen, 3 . . . Earpiece, 4 . . . Mouthpiece

The invention claimed is:

1. A signal processing circuit connected to a signal receiving conductor of a capacitive position detecting sensor, which includes a plurality of signal transmitting conductors disposed along a first direction and a plurality of the signal receiving conductors disposed along a second direction intersecting the first direction and which detects a change in capacitance corresponding to a position indication by an indicator, the signal processing circuit comprising:
a clamp circuit;
a gate circuit;
a capacitor circuit; and
a gate control circuit, wherein:
the signal receiving conductor and a first terminal of the gate circuit are connected to a first terminal of the clamp circuit,
a first terminal of the capacitor circuit is connected to a second terminal of the gate circuit,
a predetermined potential is set for each of a second terminal of the clamp circuit and a second terminal of the capacitor circuit,
the signal receiving conductor set to the predetermined potential via the clamp circuit is connected to the capacitor circuit via the gate circuit based on conduction control of the gate circuit by the gate control circuit,
the gate circuit is turned ON after the clamp circuit clamps the signal receiving conductor to the predetermined potential,
the change in the capacitance corresponding to the position indication by the indicator is output as a voltage signal from the capacitor circuit, and
the same potential is set for each of the second terminal of the clamp circuit and the second terminal of the capacitor circuit.

2. The signal processing circuit according to claim 1, wherein the clamp circuit includes a resistor and the signal receiving conductor is clamped to the predetermined potential via the resistor.

3. The signal processing circuit according to claim 1, wherein the clamp circuit includes a switch circuit and the signal receiving conductor is clamped to the predetermined potential via the switch circuit.

4. The signal processing circuit according to claim 3, wherein conduction control of the switch circuit is carried out prior to the conduction control of the gate circuit to keep the signal receiving conductor at the predetermined potential for predetermined time.

5. The signal processing circuit according to claim 4, wherein the conduction control of the switch circuit is carried out prior to the conduction control of the gate circuit, and a conduction control period is set in which the conduction control of the switch circuit and the conduction control of the gate circuit are each carried out.

6. The signal processing circuit according to claim 1, further comprising:
a multiple-integral AD conversion circuit connected to said first terminal of the capacitor circuit to output the change in the capacitance corresponding to the position indication by the indicator in a form of a digital signal.

7. The signal processing circuit according to claim 1, wherein the signal processing circuit is provided with a transmission signal generating circuit, which, in operation, supplies a transmission signal to each of the plurality of signal transmitting conductors configuring the position detecting sensor.

8. The signal processing circuit according to claim 7, wherein the transmission signal generating circuit is provided with a signal polarity inverting circuit that inverts polarity of the transmission signal supplied to the signal transmitting conductor.

9. The signal processing circuit according to claim 8, wherein if the transmission signal immediately previously supplied to a predetermined signal transmitting conductor and the transmission signal that should be supplied next are signals having the same polarity, the signal polarity inverting circuit inverts the polarity of said transmission signal that should be supplied next to the signal transmitting conductor.

10. The signal processing circuit according to claim 9, wherein the signal polarity inverting circuit, after inverting the polarity and transmitting the transmission signal having the inverted polarity to the signal transmitting conductor for a predetermined period, restores the original polarity and transmits the transmission signal having the original polarity to the signal transmitting conductor.

11. The signal processing circuit according to claim 1, further comprising:
an integral A/D conversion circuit that includes a predetermined current source and that is controlled to cause the current source cancel a charge accumulated in the capacitor circuit, to thereby convert a potential generated in the capacitor circuit to a corresponding digital signal.

12. A position detecting device, comprising:
a capacitive position detecting sensor, which includes a plurality of signal transmitting conductors disposed along a first direction and a plurality of signal receiving conductors disposed along a second direction intersecting the first direction and which detects a change in capacitance corresponding to a position indication by an indicator;

a transmission signal generating circuit that supplies a transmission signal to each of the plurality of signal transmitting conductors configuring the position detecting sensor;

a signal processing circuit that includes a clamp circuit, a gate circuit, a capacitor circuit, and a gate control circuit, wherein the signal receiving conductor of the position detecting sensor and a first terminal of the gate circuit are connected to a first terminal of the clamp circuit, a first terminal of the capacitor circuit is connected to the a second terminal of the gate circuit, a predetermined potential is set for each of a second terminal of the clamp circuit and a second terminal of the capacitor circuit, the signal receiving conductor of the position detecting sensor set to the predetermined potential via the clamp circuit is connected to the capacitor circuit via the gate circuit based on conduction control of the gate circuit by the gate control circuit, the gate circuit is turned ON after the clamp circuit clamps the signal receiving conductor to the predetermined potential, and the change in the capacitance corresponding to the position indication by the indicator is output as a voltage signal from the capacitor circuit; and a position detecting circuit that detects an indicated position of the indicator based on the voltage signal output from the signal processing circuit, wherein the same potential is set for each of the second terminal of the clamp circuit and the second terminal of the capacitor circuit.

13. A portable apparatus, comprising:
a display device; and
the position detecting device according to claim 12, wherein:
  the position detecting sensor of the position detecting device is so disposed as to overlap with a display screen of the display device, and the indicated position of the indicator detected by the position detecting circuit is displayed on the display screen of the display device.

14. A signal processing circuit connected to a signal receiving conductor of a capacitive position detecting sensor, which includes a plurality of signal transmitting conductors disposed along a first direction and a plurality of the signal receiving conductors disposed along a second direction intersecting the first direction and which detects a change in capacitance corresponding to a position indication by an indicator, the signal processing circuit comprising:
  a clamp circuit;
  a gate circuit;
  a capacitor circuit; and
  a gate control circuit, wherein:
    the signal receiving conductor and a first terminal of the gate circuit are connected to a first terminal of the clamp circuit,
    a first terminal of the capacitor circuit is connected to a second terminal of the gate circuit,
    a predetermined potential is set for each of a second terminal of the clamp circuit and a second terminal of the capacitor circuit,
    the signal receiving conductor set to the predetermined potential via the clamp circuit is connected to the capacitor circuit via the gate circuit based on conduction control of the gate circuit by the gate control circuit,
    the change in the capacitance corresponding to the position indication by the indicator is output as a voltage signal from the capacitor circuit,
    the signal processing circuit is provided with a transmission signal generating circuit for supplying a transmission signal to each of the plurality of signal transmitting conductors configuring the position detecting sensor,
    the transmission signal generating circuit is provided with a signal polarity inverting circuit that inverts polarity of the transmission signal supplied to the signal transmitting conductor, and
    if the transmission signal immediately previously supplied to a predetermined signal transmitting conductor and the transmission signal that should be supplied next are signals having the same polarity, the signal polarity inverting circuit inverts the polarity of said transmission signal that should be supplied next to the signal transmitting conductor.

15. The signal processing circuit according to claim 14, wherein the signal polarity inverting circuit, after inverting the polarity and transmitting the transmission signal having the inverted polarity to the signal transmitting conductor for a predetermined period, restores the original polarity and transmits the transmission signal having the original polarity to the signal transmitting conductor.

* * * * *